(12) United States Patent
Chien et al.

(10) Patent No.: US 9,859,276 B2
(45) Date of Patent: Jan. 2, 2018

(54) FINFET SEMICONDUCTOR DEVICE HAVING FINS WITH STRONGER STRUCTURAL STRENGTH

(71) Applicants: TAIWAN SEMICONDUCTOR MANUFACTURING CO., LTD., Hsinchu (TW); NATIONAL CHIAO-TUNG UNIVERSITY, Hsinchu (TW)

(72) Inventors: Chao-Hsin Chien, Hsinchu (TW); Chen-Han Chou, Hsinchu (TW); Cheng-Ting Chung, Hsinchu (TW); Samuel C. Pan, Hsinchu (TW)

(73) Assignees: Taiwan Semiconductor Manufacturing Co., Ltd., Hsinchu (TW); National Chiao-Tung University, Hsinchu (TW)

(*) Notice: Subject to any disclaimer, the term of this patent is extended or adjusted under 35 U.S.C. 154(b) by 0 days.

(21) Appl. No.: 15/292,406

(22) Filed: Oct. 13, 2016

(65) Prior Publication Data

US 2017/0125415 A1 May 4, 2017

Related U.S. Application Data

(63) Continuation of application No. 14/686,746, filed on Apr. 14, 2015, now Pat. No. 9,496,259.

(51) Int. Cl.
*H01L 21/8234* (2006.01)
*H01L 27/088* (2006.01)
*H01L 29/06* (2006.01)
*H01L 29/08* (2006.01)
*H01L 29/423* (2006.01)
*H01L 29/78* (2006.01)
*H01L 27/02* (2006.01)

(52) U.S. Cl.
CPC .. *H01L 27/0886* (2013.01); *H01L 21/823431* (2013.01); *H01L 27/0207* (2013.01); *H01L 29/0657* (2013.01); *H01L 29/0847* (2013.01); *H01L 29/42356* (2013.01); *H01L 29/7853* (2013.01)

(58) Field of Classification Search
CPC ......... H01L 21/823431; H01L 27/0886; H01L 29/7853
USPC .......................................... 257/288; 438/284
See application file for complete search history.

(56) References Cited

U.S. PATENT DOCUMENTS 8,487,378 B2 7/2013 Goto et al.
8,502,289 B2 * 8/2013 Wang ................ H01L 29/66795
257/288

(Continued)

OTHER PUBLICATIONS

Digh Hisamoto et al., "FinFET—A Self-Aligned Double-Gate MOSFET Scalable to 20 nm", IEEE Transactions on Electron Devices, vol. 47, No. 12, Dec. 2000.

(Continued)

*Primary Examiner* — George Fourson, III
(74) *Attorney, Agent, or Firm* — McDermott Will & Emery LLP

(57) ABSTRACT

A semiconductor device including at least one fin disposed on a surface of a semiconductor substrate is provided. The fin includes a main portion extending along a first direction, and at least one secondary portion extending outward from the main portion along a second direction not collinear with the first direction.

20 Claims, 16 Drawing Sheets

(56) References Cited

U.S. PATENT DOCUMENTS

| | | | |
|---|---|---|---|
| 8,729,634 | B2 | 5/2014 | Shen et al. |
| 8,826,213 | B1 | 9/2014 | Ho et al. |
| 8,887,106 | B2 | 11/2014 | Ho et al. |
| 9,112,032 | B1* | 8/2015 | Liu .................. H01L 29/66795 |
| 2004/0061178 | A1 | 4/2004 | Lin et al. |
| 2005/0014318 | A1 | 1/2005 | Manger |
| 2005/0051825 | A1* | 3/2005 | Fujiwara ........... H01L 29/41733 |
| | | | 257/308 |
| 2005/0093154 | A1 | 5/2005 | Kottantharayil et al. |
| 2005/0124120 | A1* | 6/2005 | Du .................. H01L 21/823437 |
| | | | 438/283 |
| 2005/0258476 | A1 | 11/2005 | Cheng et al. |
| 2006/0091481 | A1 | 5/2006 | Li et al. |
| 2006/0237777 | A1 | 10/2006 | Choi et al. |
| 2007/0141763 | A1 | 6/2007 | Choi et al. |
| 2007/0257277 | A1* | 11/2007 | Takeda ................ H01L 27/11 |
| | | | 257/204 |
| 2009/0309162 | A1* | 12/2009 | Baumgartner .... H01L 29/66818 |
| | | | 257/368 |
| 2010/0117156 | A1* | 5/2010 | Tsutsui ............ H01L 21/823418 |
| | | | 257/368 |
| 2011/0204419 | A1 | 8/2011 | Johnson et al. |
| 2013/0105867 | A1 | 5/2013 | Wang et al. |
| 2013/0313610 | A1 | 11/2013 | Sell |
| 2014/0282326 | A1 | 9/2014 | Chen et al. |
| 2015/0041899 | A1 | 2/2015 | Yang et al. |
| 2015/0145042 | A1* | 5/2015 | Bu ...................... H01L 27/1211 |
| | | | 257/347 |
| 2015/0364595 | A1* | 12/2015 | Liu .................. H01L 29/66795 |
| | | | 257/401 |
| 2017/0103923 | A1* | 4/2017 | Nidhi .............. H01L 21/823412 |

OTHER PUBLICATIONS

Stephen H. Tang et al., "FinFET—"A Quasi-Planar Double-Gate MOSFET", 2001 IEEE International Solid-State Circuits Conference", Feb. 6, 2001.

Non-Final Office Action U.S. Appl. No. 14/686,746 dated Jan. 7, 2016.

Final Office Action U.S. Appl. No. 14/686,746 dated Apr. 26, 2016.

Notice of Allowance U.S. Appl. No. 14/686,746 dated Jul. 19, 2016.

Office Action Taiwanese Patent Application No. 10521215240 dated Oct. 4, 2016.

* cited by examiner

FINFET SEMICONDUCTOR DEVICE HAVING FINS WITH STRONGER STRUCTURAL STRENGTH

CROSS-REFERENCE TO RELATED APPLICATIONS

This case is a Continuation Application of U.S. application Ser. No. 14/686,746 filed Apr. 14, 2015, the subject matter of which is incorporated herein by reference in entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. The fin transistor has a channel (referred to as a fin channel) associated with a top surface and opposite sidewalls. The fin channel has a total channel width defined by the top surface and the opposite sidewalls. Although existing FinFET devices and methods of fabricating FinFET devices have been generally adequate for their intended purposes, they have not been entirely satisfactory in all respects. For example, as the devices become smaller the thickness of fins decreases and the fins become more fragile and can break.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
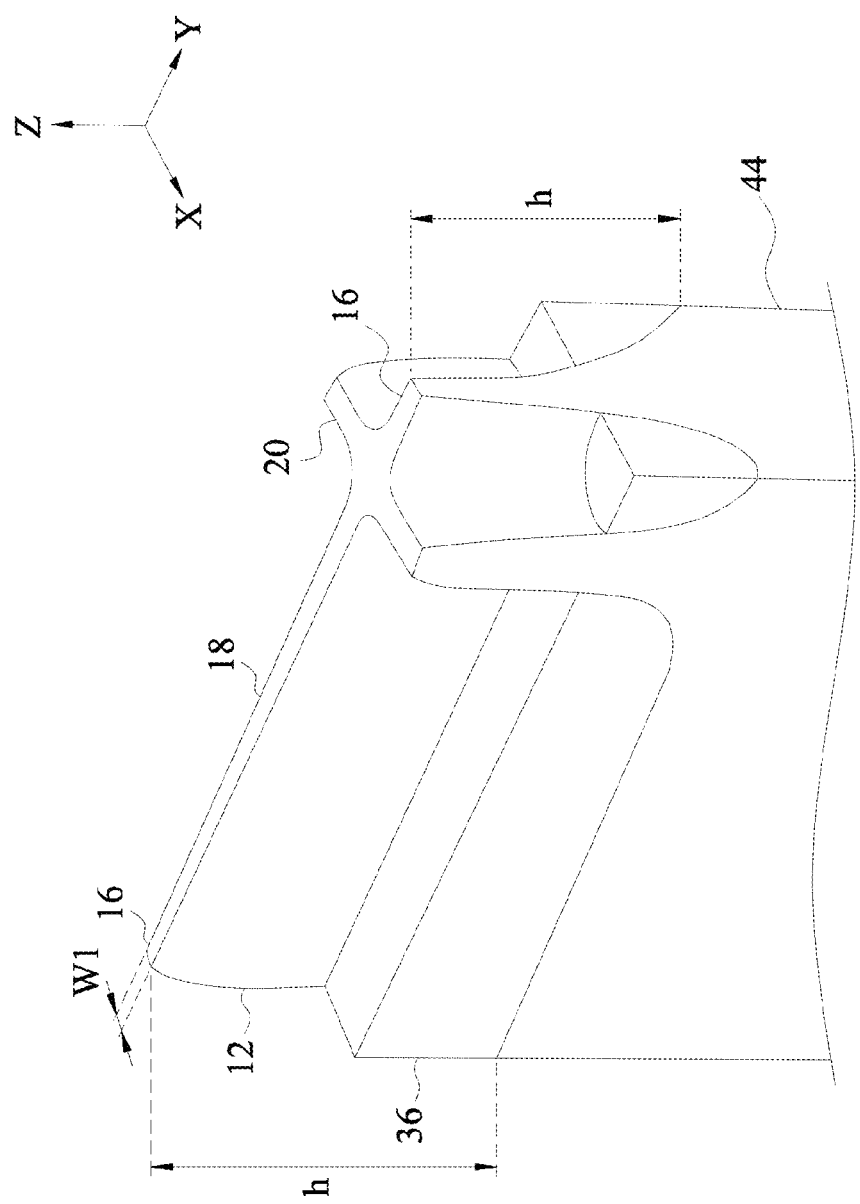
FIG. 1 is an isometric view of an embodiment of the disclosure having a single cross shape.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Examples of devices that can benefit from one or more embodiments of the present disclosure are semiconductor devices. Such a device, for example, is a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will include a FinFET example to illustrate various embodiments of the present application. It is understood, however, that the application should not be limited to a particular type of device, except as specifically claimed.

As shown in FIGS. 1-8L, fins and semiconductor devices according to various embodiments of the disclosure are described below. The semiconductor devices according to these embodiments are FinFETs.

According to an embodiment of the disclosure, FinFETs are formed with fins having portions extending outward from the main surface of the fin. An embodiment of a fin 12 with an extending portion 20 is illustrated in FIG. 1. The embodiment illustrated is a single cross shape fin 12 with a main portion 18 extending in a first direction Y having a middle region 14 between and two opposing end regions 16 at each end of the fin 12. At one end region 16, a secondary portion 20 intersects the main portion 18 and extends away from opposing main sides of the fin 12 in a second direction X. The secondary portions 20 are not collinear with the main portion 18. In some embodiments, the second direction X is substantially perpendicular to the first direction Y.

Figure 2B:
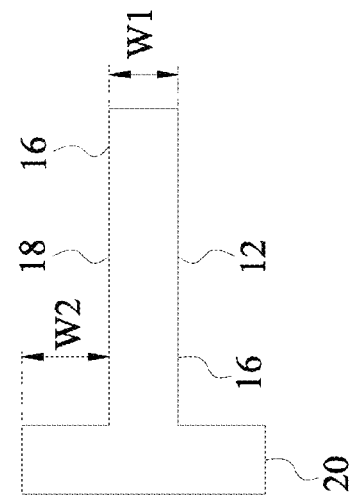
FIG. 2B is a plan view of another embodiment of the disclosure having a T shape.
Figure 2D:
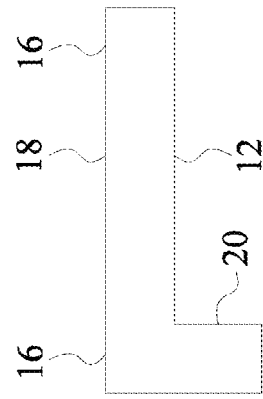
FIG. 2D is a plan view of another embodiment of the disclosure.
Figure 2A:
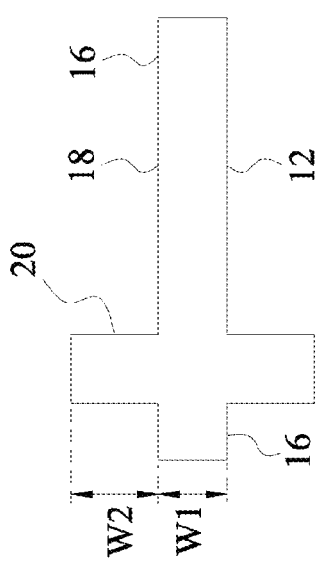
FIG. 2A is a plan view of the embodiment of the disclosure having a single cross shape.
Figure 2C:
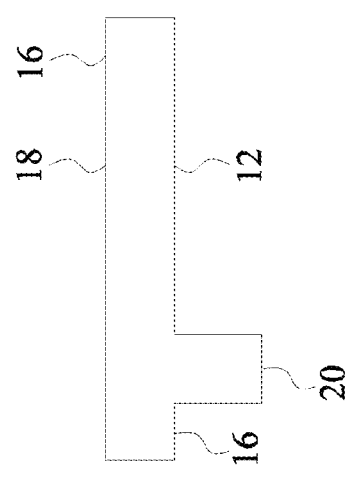
FIG. 2C is a plan view of another embodiment of the disclosure.

Embodiments of the fin 12 are shown in plan view in FIGS. 2A-2D. The secondary portion 20 may intersect the main portion 18 of the fin in the end regions 16. The secondary portion 20 may intersect the main portion 18 of the fin near the end of the main portion 18 forming a cross shape, as shown in FIG. 2A, or at the end of the main portion 18 forming a T-shape, as shown in FIG. 2B. Alternatively, the secondary portion 20 may extend outward from one side of the main portion 18 in the end regions 16, as shown in FIGS. 2C and 2D.

Figure 3:
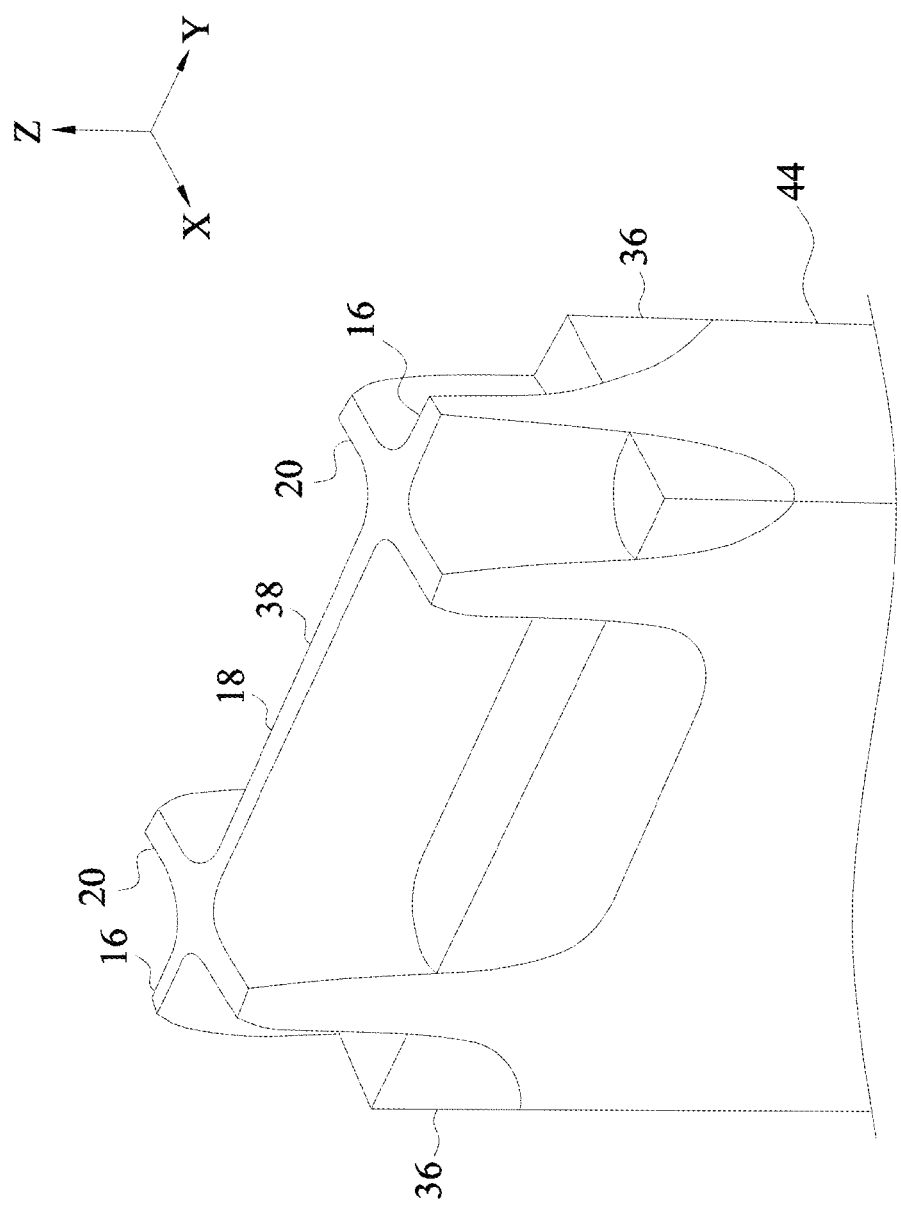
FIG. 3 is an isometric view of another embodiment of the disclosure having a dual cross shape.

The fin may have a plurality of secondary portions extending outward from the main portion, as shown in FIG. 3. The embodiment illustrated is a dual cross shape fin 38 having two secondary portions 20 intersecting the main portion 18. In this embodiment, a secondary portion 20 intersecting the main portion 18 is formed at each end region 16 of the fin 12. Each secondary portion 20 may extend in a direction X substantially perpendicular to the direction Y in which the main portion 18 of the fin extends.

Figure 4B:
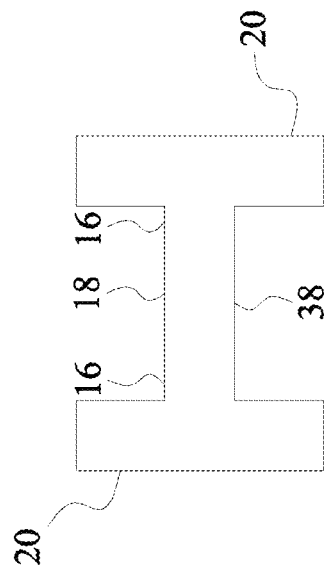
FIG. 4B is a plan view of another embodiment of the disclosure having an H shape.
Figure 4D:
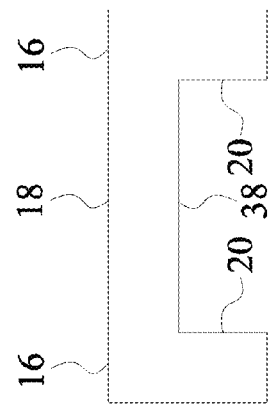
FIG. 4D is a plan view of another embodiment of the disclosure.
Figure 4A:
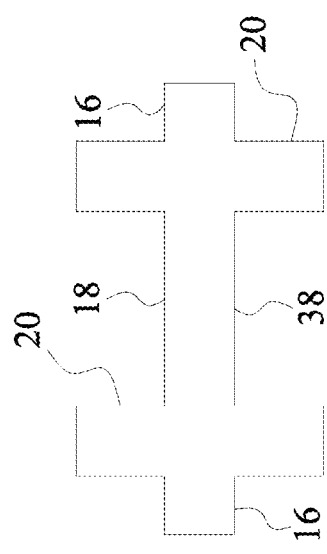
FIG. 4A is a plan view of the embodiment of the disclosure having a dual cross shape.
Figure 4C:
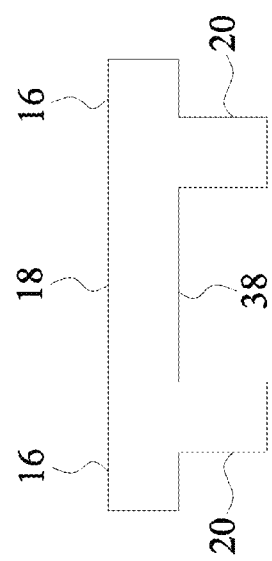
FIG. 4C is a plan view of another embodiment of the disclosure.
Figure 4E:
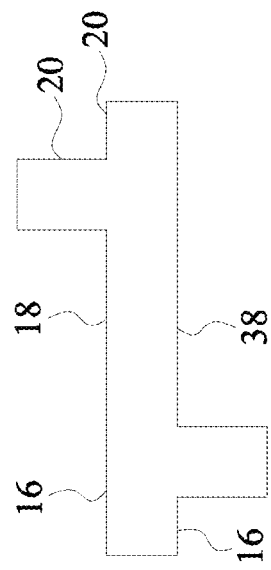
FIG. 4E is a plan view of another embodiment of the disclosure.
Figure 4F:
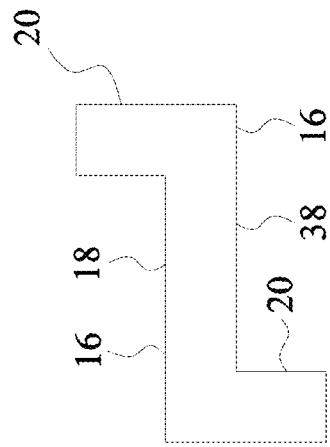
FIG. 4F is a plan view of another embodiment of the disclosure.
Figure 4G:
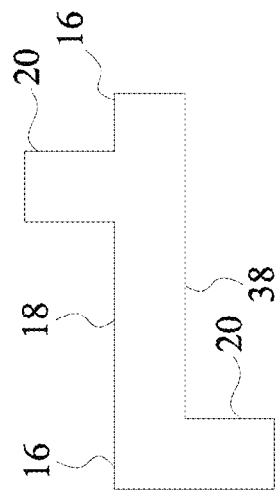
FIG. 4G is a plan view of another embodiment of the disclosure.

Embodiments of the fin 38 are shown in plan view in FIGS. 4A-4G. The secondary portion 20 may intersect the main portion 18 of the fin at the end regions 16. The secondary portions 20 may intersect the main portion 18 of the fin near the end of the main portion, as shown in FIG. 4A, or at the end of the main portion 18 forming an H-shape, as shown in FIG. 4B. Alternatively, the secondary portions 20 may extend outward from one side of the main portion 18 in the end regions 16, as shown in FIGS. 4C and 4D. As shown in FIGS. 4E, 4F, and 4G, the secondary portions 20 may also extend from opposing sides of the main portion 18.

Figure 5:
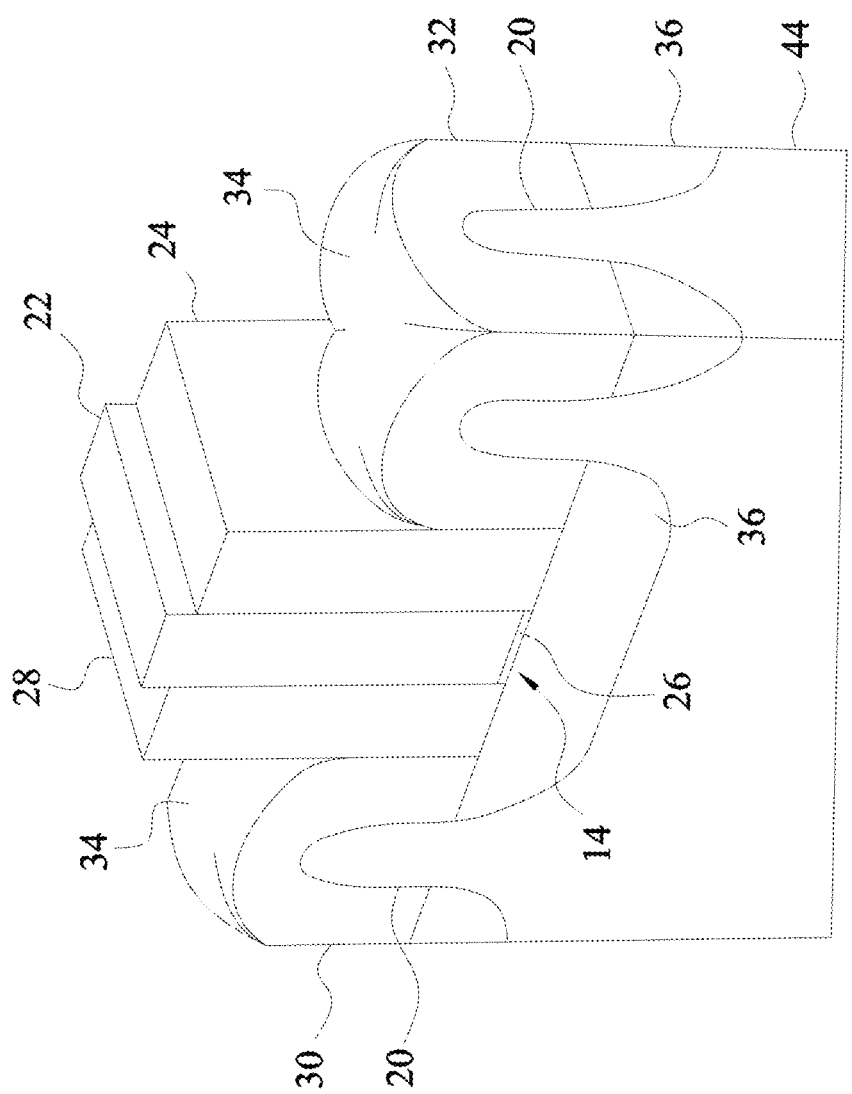
FIG. 5 is an isometric view of a FINFET having a dual cross shaped fin according to an embodiment of the disclosure.

An embodiment of a semiconductor device 40 with the dual cross shape fin is shown in FIG. 5. A gate structure 22 is formed over the middle region 14 of the fin. The gate structure includes a gate dielectric layer 26 formed overlying the middle region 14 of the fin. A gate electrode 24 is formed overlying the gate dielectric layer 26, and sidewall spacers 28 are formed on main surfaces of the gate electrode. Source 30 and drain 32 regions are formed overlying the secondary portions 20 of the fin at the end regions of 16 of the fin. In some embodiments a strain layer 34, such as a SiC layer (for an NMOS) or a SiGe layer (for a PMOS) is formed overlying the source/drain regions 30, 32. In some embodiments, an insulating layer 36 is formed on a semiconductor substrate 44 at the lower regions of the fin. The insulating layer 36 can be a shallow trench isolation region.

The fins 12, 38 according to the present disclosure are formed on a semiconductor substrate 44. In one embodiment, the semiconductor substrate 44 is a silicon substrate. Alternatively, the semiconductor substrate may include germanium, silicon germanium, gallium arsenide or other appropriate semiconductor materials. Also alternatively, the semiconductor substrate may include an epitaxial layer. For example, the semiconductor substrate may have an epitaxial layer overlying a bulk semiconductor. Further, the semiconductor substrate may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrates may be formed by selective epitaxial growth (SEG). Furthermore, the semiconductor substrate may include a semiconductor-on-insulator (SOI) structure. Also alternatively, the semiconductor substrate may include a buried dielectric layer, such as a buried oxide (BOX) layer, such as that formed by separation by implantation of oxygen (SIMOX) technology, wafer bonding, SEG, or other appropriate method. In other embodiments, the substrate may comprise a compound semiconductor including IV-IV compound semiconductors such as SiC and SiGe, III-v compound semiconductors such as GaAs, GaP, GaN, InP, InAs, InSb, GaAsP, AlGaN, AlInAs, AlGaAs, GaInAs, GaInP, and/or GaInAsP; or combinations thereof.

The fin is disposed over the semiconductor substrate and the fin may be made of the same material as the semiconductor substrate and may continuously extend from the semiconductor substrate. The fins may be formed by selectively etching the semiconductor substrate. Alternatively, the fins may be formed using an EPI first method. In the EPI first methods, an epitaxial layer is formed on the semiconductor substrate, and then the epitaxial layer is subsequently patterned to form fins.

A photolithography process can be used to define fins on the semiconductor substrate. In some embodiments, a hard mask layer is formed on the semiconductor substrate. The hard mask layer may comprise a bilayer of SiN and SiO$_2$. A photoresist layer is spin-on coated on semiconductor substrate. The photoresist is patterned by selective exposure of the photoresist to actinic radiation. Generally, a patterning process may include photoresist coating (e.g., spin-on coating), soft baking, mask aligning, exposing, post-exposure baking, developing the photoresist, rinsing, drying (e.g., hard baking), other suitable processes, or combinations thereof. Alternatively, the photolithography exposing process is implemented or replaced by other proper methods such as maskless photolithography, electron-beam writing, direct-writing, and/or ion-beam writing.

The pattern of the photoresist layer is subsequently transferred into the hard mask layer by etching the exposed area of the hard mask layer. The hard mask layer is subsequently used as a mask during etching of the semiconductor substrate. The semiconductor substrate may be etched by various methods, including a dry etch, a wet etch, or a combination of dry etch and wet etch. The dry etching process may implement fluorine-containing gas (e.g., CF$_4$, SF$_6$, CH$_2$F$_2$, CHF$_3$, and/or C$_4$F$_8$), chlorine-containing gas (e.g., Cl$_2$, CHCl$_3$, CCl$_4$, and/or BCl$_3$), bromine-containing gas (e.g., HBr and/or CHBr$_3$), oxygen-containing gas, iodine-containing gas, other suitable gases and/or plasmas, or combinations thereof. The etching process may include a multiple-step etching to gain etch selectivity, flexibility and desired etch profile.

Referring to FIG. 5, a semiconductor device 40 according to an embodiment of the disclosure includes an insulating material 36 formed over the semiconductor substrate 44 along lower portions of the fin. The insulating material may be deposited when forming shallow trench isolation (STI) regions between a plurality of fins in embodiments comprising a plurality of fins. The STI regions may comprise silicon oxide, silicon nitride, silicon oxynitride, other suitable materials, and combinations thereof. STI regions may be formed by any suitable process. As one embodiment, the STI regions are formed by filling the region between fins with one or more dielectric materials by using a chemical vapor deposition (CVD). In some embodiments, the filled region may have a multi-layer structure such as a thermal oxide liner layer filled with silicon nitride or silicon oxide. An annealing process may be performed after the formation of the STI region. The annealing process includes rapid thermal annealing (RTA), laser annealing processes, or other suitable annealing processes.

In some embodiments, the STI regions are formed using flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once at temperatures, such as in a range from about 1000° C. to about 1200° C., and for an extended period, such as 30 hours or more in total.

A chemical mechanical polishing (CMP) operation is performed to remove excess material from the STI region and to provide a substantially planar surface. Dopant is subsequently implanted into the fins to form n and p wells and then the device is subsequently annealed. The STI region is etched back to remove a portion of the STI region and expose the upper portions of the fins where the gate structure 22, and source/drain regions 30, 32 are subsequently formed. The formation of the gate electrode structure may include additional depositing, patterning, and etching processes. The STI removal is performed by a suitable etching process, such as a semi-isotropic etch using HF+NH$_3$ without plasma or NF$_3$+NH$_3$ with plasma; or an isotropic etch, such as dilute HF.

The gate structure formation process includes the operations of depositing a gate dielectric, depositing a gate electrode, patterning the gate, and lightly doped drain (LDD) implantation and annealing. Sidewall spacers are subsequently formed on the gate structure, and source/drain implantation and annealing is performed.

The gate dielectric 26 may comprise silicon oxide, silicon nitride, silicon oxynitride, high-k dielectric material, other suitable dielectric material, and/or combinations thereof. The gate electrode 24 may comprise any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof.

In certain embodiments, the FinFET can be fabricated using a gate first method or a gate last method. In embodiments using a high-k metal gate (HK/MG), a gate last method is employed to form the gate electrode. In the gate last method, a dummy gate is formed, the dummy gate is subsequently removed at a later operation after a high temperature annealing operation, and the high k metal gate (HK/MG) is formed.

According to embodiments of the disclosure, the high k gate dielectric may comprise HfO$_2$, HfSiO, HfSiON, HfTaO, HfTiO, HfZrO, zirconium oxide, aluminum oxide, hafnium dioxide-alumina (HfO$_2$—Al$_2$O$_3$) alloy, other suitable high-k dielectric materials, or combinations thereof. The metal gate material may comprise one or more layers of Ti, TiN, titanium-aluminum alloy, Al, AlN, Ta, TaN, TaC, TaCN, TaSi, and the like.

In some embodiments, the sidewall spacers 28 are used to offset subsequently formed doped regions, such as source/drain regions. The sidewall spacers 28 may further be used for designing or modifying the source/drain region (junction) profile. The sidewall spacers 28 may be formed by suitable deposition and etch techniques, and may comprise silicon nitride, silicon carbide, silicon oxynitride, other suitable materials, or combinations thereof.

Figure 6A:
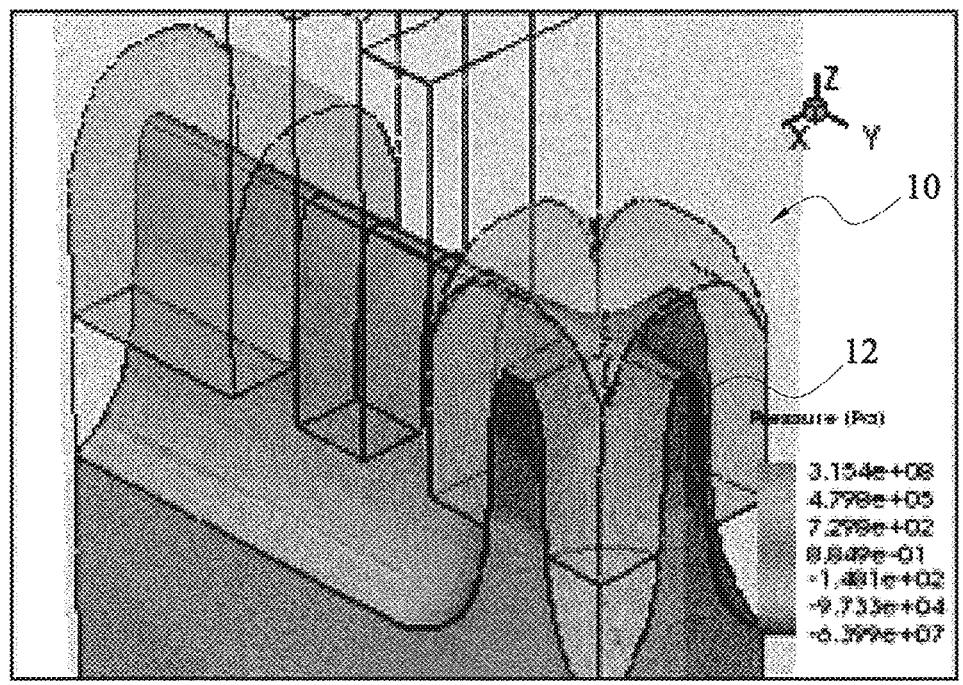
FIG. 6A is an isometric view of single cross shaped fin showing stress in the fin according to an embodiment of the disclosure.
Figure 6B:
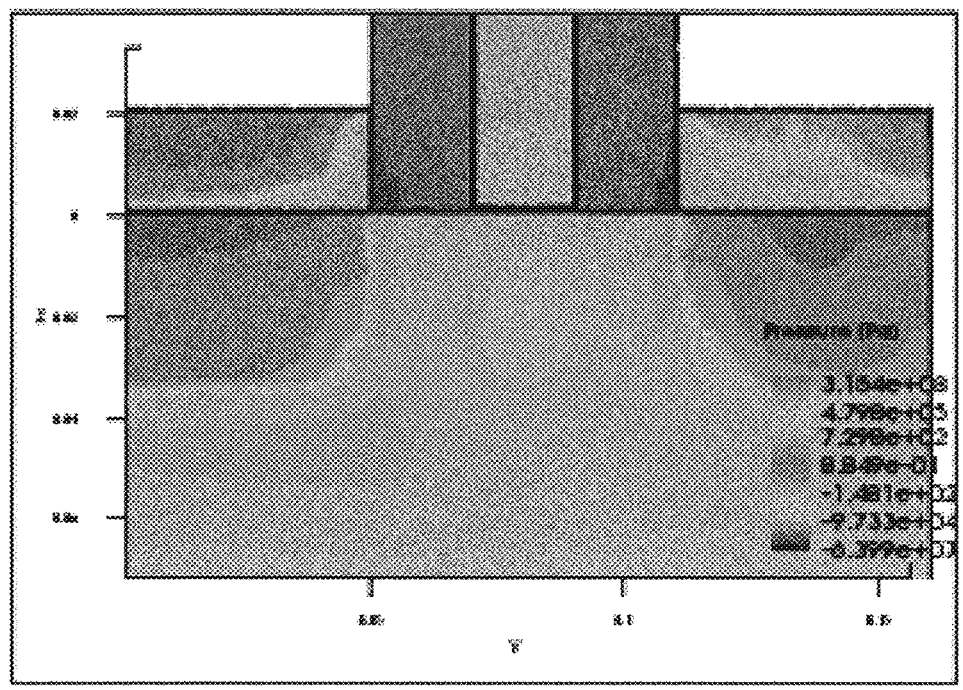
FIG. 6B is a cross section view of single cross shaped fin showing stress in the fin.
Figure 6C:
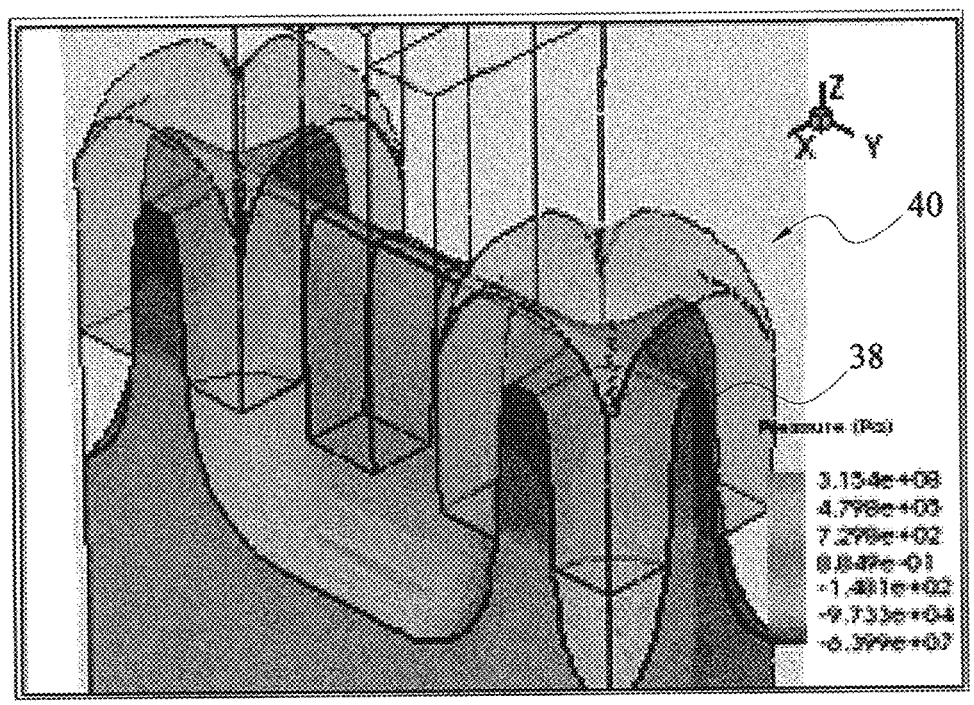
FIG. 6C is an isometric view of dual cross shaped fin showing stress in the fin according to an embodiment of the disclosure.

In certain embodiments, the FinFET may include raised source/drain regions 30, 32, as shown in FIGS. 5, 6A and 6C. The raised source/drain regions 30, 32 are formed on the end regions 16 of the fins. The raised source/drain regions 30, 32 may be formed by one or more epitaxy or epitaxial (epi) processes, such that Si features, SiC features, SiGe features, or Group III-V semiconductor material on Si EPI or other suitable features are formed in a crystalline state on the fins.

The epitaxy processes include CVD deposition techniques (e.g., vapor-phase epitaxy (VPE) and/or ultra-high vacuum CVD (UHV-CVD)), molecular beam epitaxy, and/or other suitable processes.

In some embodiments, the source/drain materials may be strained source/drain materials. Examples of strained source/drain materials include SiC in an n-type metal oxide semiconductor (NMOS) and SiGe in p-type metal oxide semiconductor (PMOS).

The gate electrodes 24 in certain embodiments are formed of polysilicon and may include a hard mask formed over the gate electrode 24. The hard mask may be made a suitable hard mask material, including $SiO_2$, SiN, or SiCN. The gate electrode structure may comprise additional layers such as interfacial layers, capping layers, diffusion/barrier layers, dielectric layers, conductive layers, and other suitable layers, and combinations thereof.

In some embodiments of the disclosure, source/drain electrodes are formed contacting the respective source/drain regions. The electrodes may be formed of a suitable conductive material, such as copper, tungsten, nickel, titanium, or the like. In some embodiments a metal silicide is formed at the conductive material and source/drain interface to improve conductivity at the interface. In one example, a damascene and/or dual damascene process is used to form copper-based multilayer interconnection structures. In another embodiment, tungsten is used to form tungsten plugs.

Subsequent processing according to embodiments of the disclosure may also form various contacts/vias/lines and multilayer interconnects features (e.g., metal layers and interlayer dielectrics) on the semiconductor substrate, configured to connect the various features or structures of the FinFET device. For example, a multilayer interconnection includes vertical interconnects, such as conventional vias or contacts, and horizontal interconnects, such as metal lines.

In certain embodiments, the width W1 of the main portion 18 of the fin between opposing main sides is about 3 nm to about 20 nm. In certain embodiments, W1 is between about 5 nm and 15 nm. In certain embodiments, W1 is about 7 nm. The height h of the fin 12, 38 measured from the base of the fin at the bottom depth of the etched area of the semiconductor substrate to the top surface of the fin region is in a range of about 30 nm to about 300 nm in some embodiments, and may be in a range of about 30 nm to 100 nm in other embodiments. In one embodiment, the height h of the fin may be about 42 nm. In some embodiments, an aspect ratio (W1/h) of the fin ranges from about 0.01 to about 0.66. In some embodiments, the aspect ratio of the fin ranges from about 0.05 to about 0.50.

In certain embodiments, secondary portions 20 extend a distance W2 outward from the main portion 18 of the fin, wherein $0.14W1 \leq W2 \leq 7W1$. In some embodiments, the secondary portion extends about 3 nm to about 20 nm outward along the second direction Y from a main surface of the main portion 18 of the fin. In some embodiments, the secondary portion 20 extends about 5 nm to about 7 nm outward along the second direction from the main surface of the main portion 18 of the fin.

In certain embodiments with secondary portions 20 extending from opposing main sides of the main portion 18 of the fin, the secondary portions 20 extending on opposing main sides may extend the same distance or different distances from the main portion 18 of the fin.

As shown in FIGS. 6A-6F, the secondary portions 20 have an effect on controlling the stress in the channel region of a FinFET. FIG. 6A is a simulation of the stress in a single cross shape fin 12 of a semiconductor device 10 having a secondary portion 20 formed at an end region 16 of the fin. The ghost lines show the outline of a gate structure and source/drain regions formed on the fin 12. FIG. 6B is a cross section taken along the first direction Y of the fin 12.

Figure 6D:
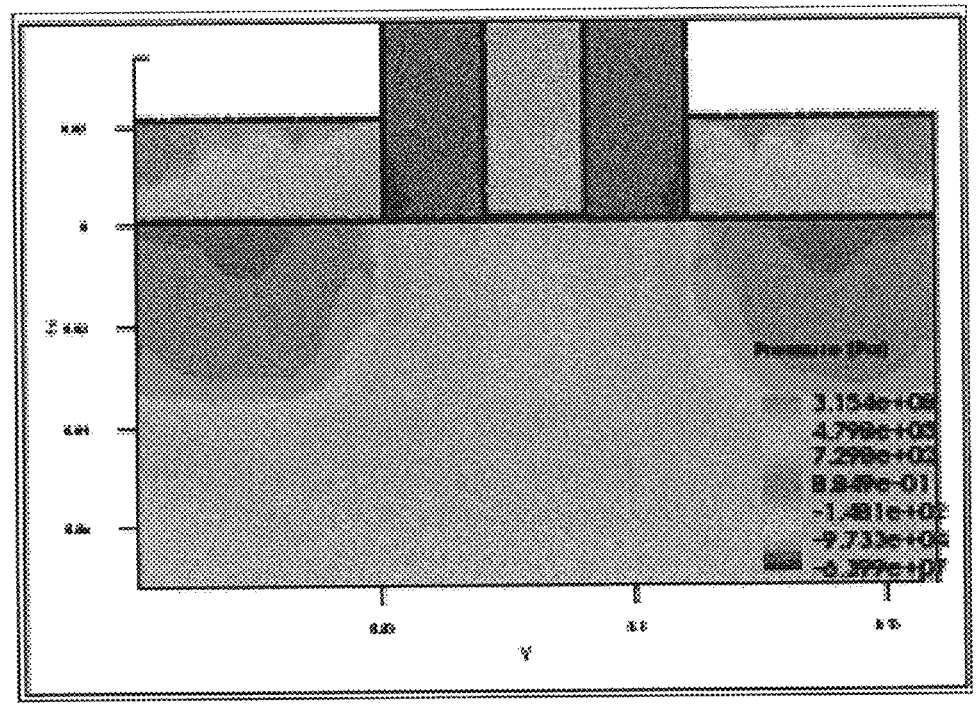
FIG. 6D is a cross section view of the dual cross shaped fin showing stress in the fin.

FIGS. 6C and 6D illustrates a simulation result of the stress in a dual cross shape fin 38 in a semiconductor device 40 having a secondary portion 20 formed at each end portion 16 of the fin 38. The ghost lines show the outline of a gate structure and source and drains formed on the fin 12. FIG. 6D is a cross section taken along the first direction Y of the fin 38. The stress in the fin 38 with two secondary portions 20 is less than the stress in the embodiment with a single secondary portion (see FIGS. 6A and 6B).

Figure 6E:
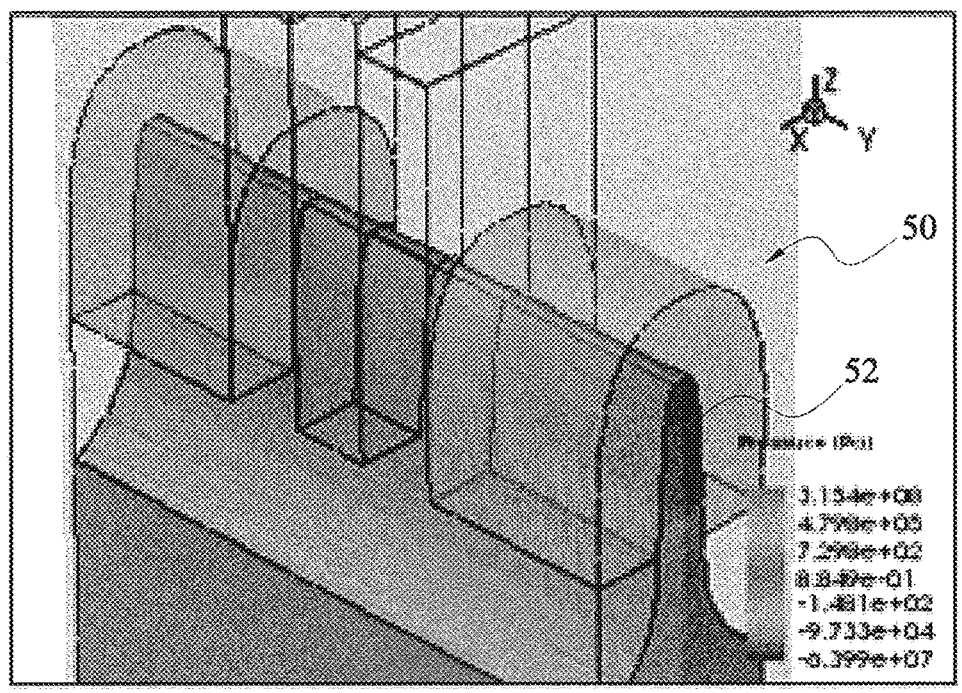
FIG. 6E is an isometric view of a conventional fin showing stress in the fin.
Figure 6F:
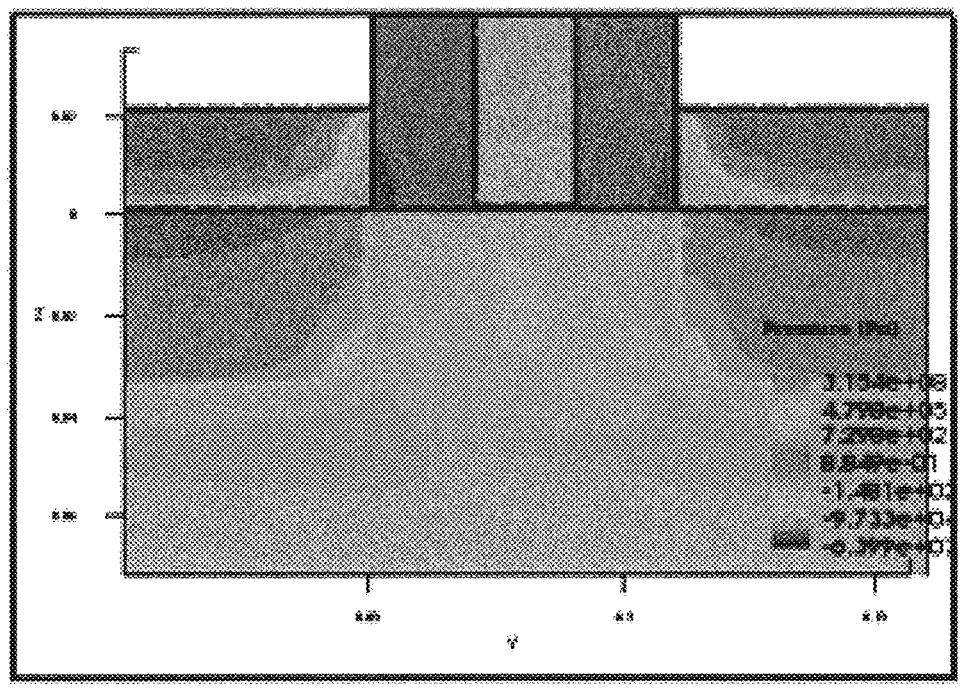
FIG. 6F is a cross section view of a conventional fin showing stress in the fin.

Compared to single and dual secondary portion structures of FIGS. 6A-6D, a semiconductor device 50 having a fin 52 without the secondary portions has a greater amount of stress in the fin, as shown in FIG. 6E and FIG. 6F. FIG. 6F is a cross section taken along the first direction Y of fin 52.

Figure 7A:
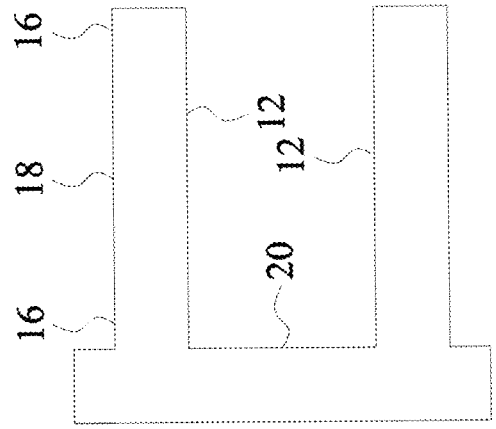
FIG. 7A is a plan view of another embodiment of the disclosure having two fins and single cross shape.
Figure 7B:
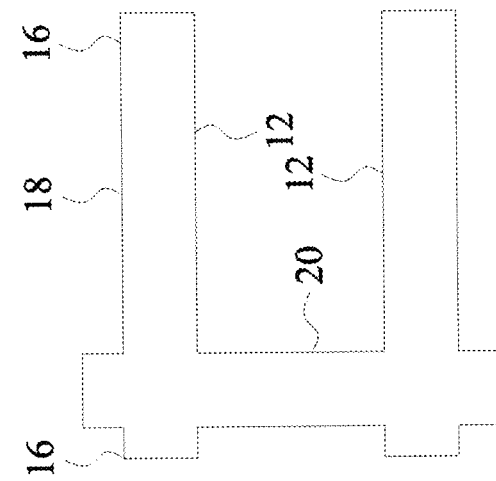
FIG. 7B is a plan view of another embodiment of the disclosure having two fins.
Figure 7D:
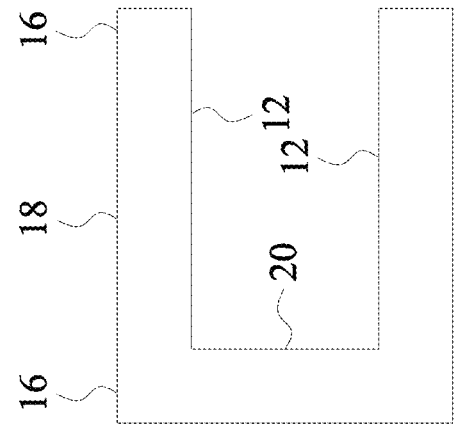
FIG. 7D is a plan view of another embodiment of the disclosure having two fins and a C shape.
Figure 7C:
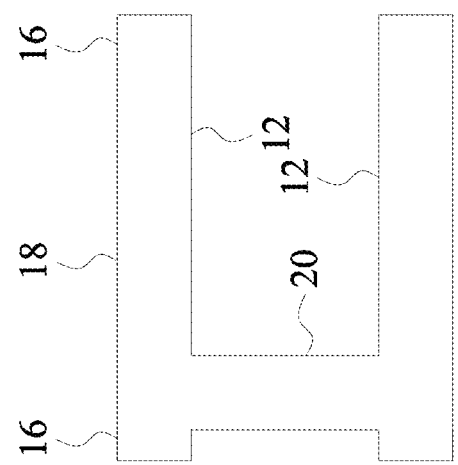
FIG. 7C is a plan view of another embodiment of the disclosure having two fins.
Figure 7E:
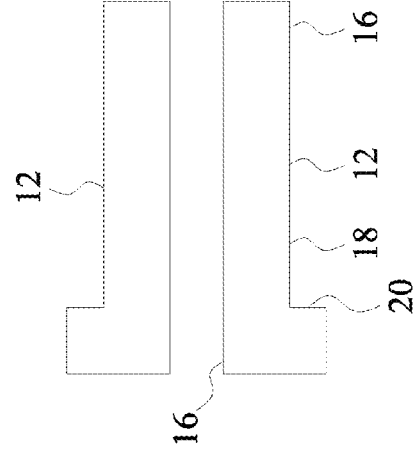
FIG. 7E is a plan view of another embodiment of the disclosure having two fins.
Figure 7F:
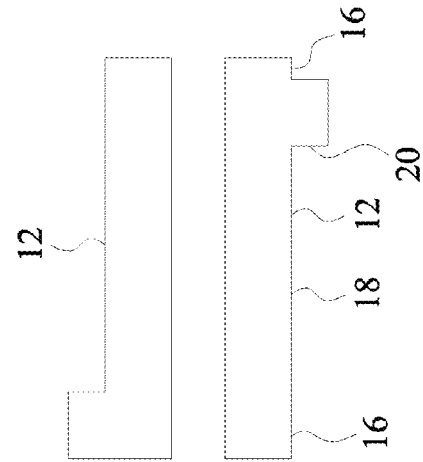
FIG. 7F is a plan view of another embodiment of the disclosure having two fins.
Figure 7G:
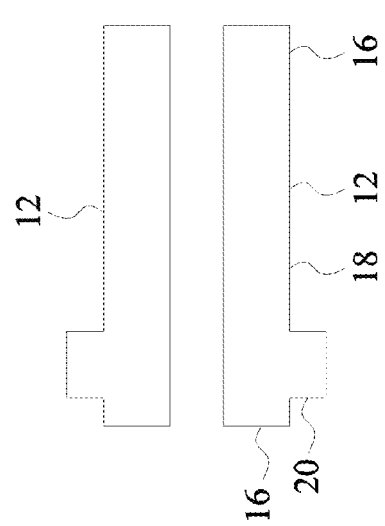
FIG. 7G is a plan view of another embodiment of the disclosure having two fins.
Figure 7H:
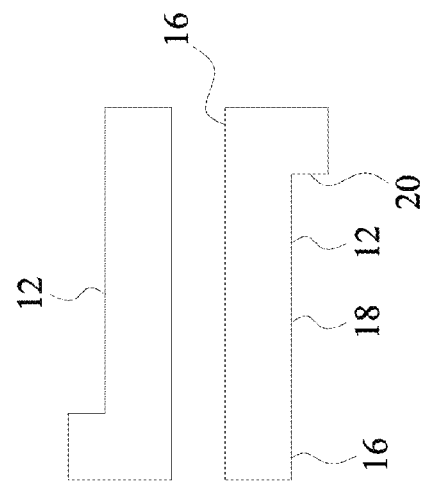
FIG. 7H is a plan view of another embodiment of the disclosure having two fins.

In some embodiments of the disclosure, a semiconductor device includes a plurality of fins. In some embodiments, the main portions 18 of the plurality of fins are arranged substantially parallel to each other, as shown in FIGS. 7A-7H. The secondary portions 20 of immediately adjacent fins 12 may be connected to each other forming a C-shape, as shown in plan views in FIGS. 7A-7D. The secondary portions 20 may extend from the main portion 18 of the fin near the end of the main portion, as shown in FIG. 7A, or at the end of the main portion 18, as shown in FIG. 7B. Alternatively, the secondary portions 20 may be formed only in the region between two immediately adjacent fins thereby connecting each of the fins, as shown in FIGS. 7C and 7D. In other non-limiting embodiments, the secondary portions 20 may be formed extending outward from opposing sides of immediately adjacent fins 18, as shown in FIGS. 7E, 7F, 7G, and 7H. In certain embodiments, the configuration with the secondary portions on opposing sides of immediately adjacent fins provides a shorter pitch between adjacent fins with the secondary portions than if the secondary fins were on facing sides of immediately adjacent fins. Other configurations of the secondary portions within the scope of this disclosure would be apparent to one of ordinary skill in this art.

Immediately adjacent fins 12 may be spaced apart from each other at intervals of about 20 to 60 nm. In certain embodiments, the immediately adjacent fins 12 are spaced apart from each other at an interval of about 42 nm between centers of immediately adjacent fins 12.

Figure 8B:
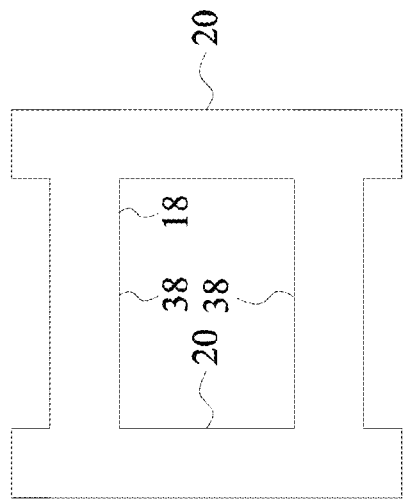
FIG. 8B is a plan view of another embodiment of the disclosure having two fins.
Figure 8D:
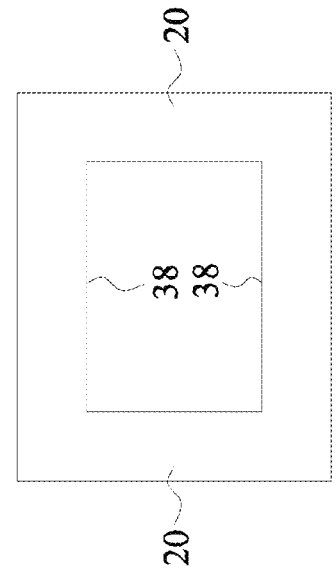
FIG. 8D is a plan view of another embodiment of the disclosure having two fins.
Figure 8A:
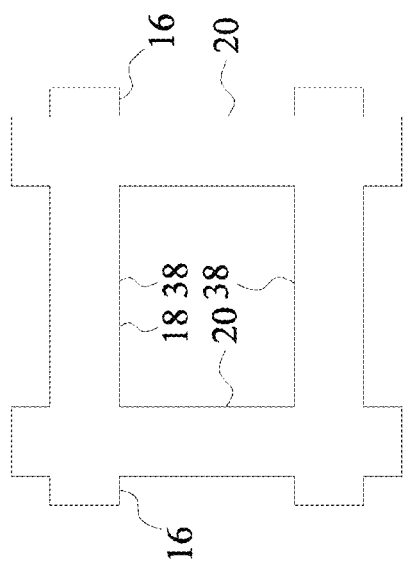
FIG. 8A is a plan view of another embodiment of the disclosure having two fins and a dual cross shape.
Figure 8C:
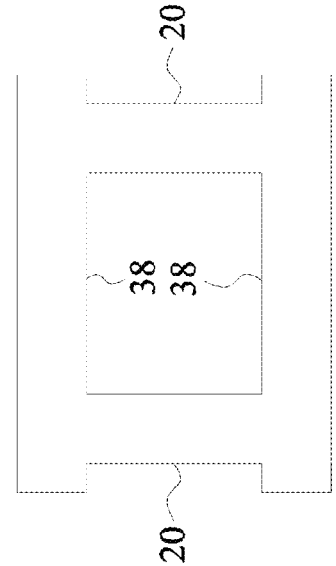
FIG. 8C is a plan view of another embodiment of the disclosure having two fins.
Figure 8E:
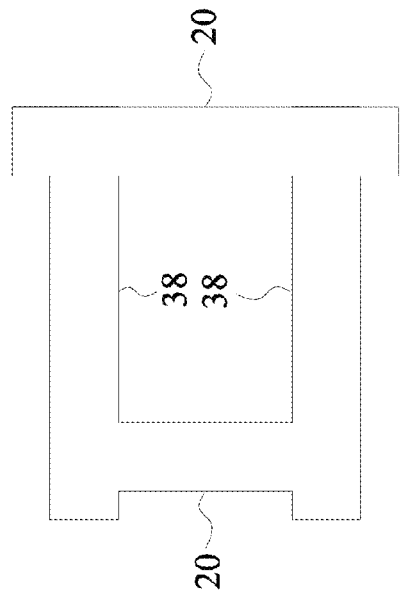
FIG. 8E is a plan view of another embodiment of the disclosure having two fins.
Figure 8F:
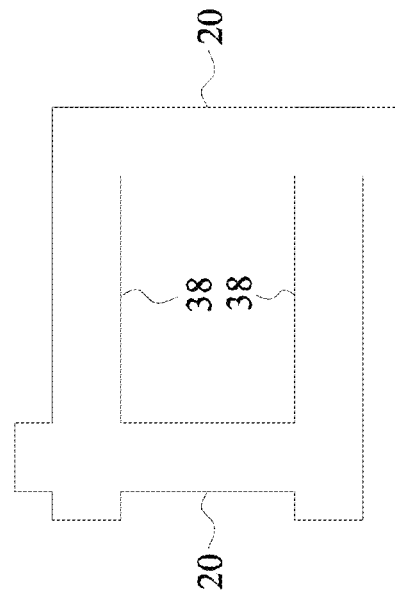
FIG. 8F is a plan view of another embodiment of the disclosure having two fins.
Figure 8G:
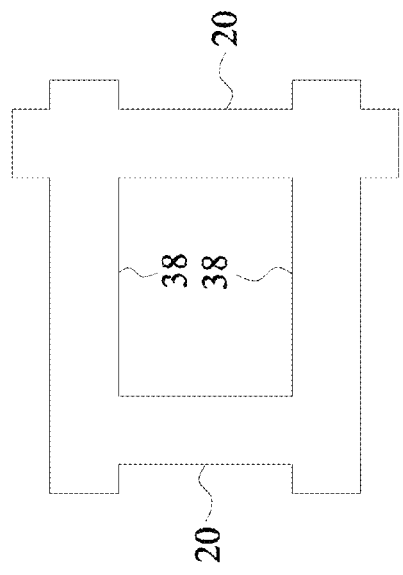
FIG. 8G is a plan view of another embodiment of the disclosure having two fins.
Figure 8H:
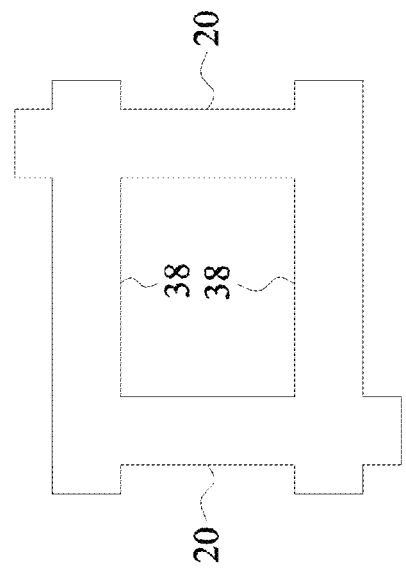
FIG. 8H is a plan view of another embodiment of the disclosure having two fins.
Figure 8I:
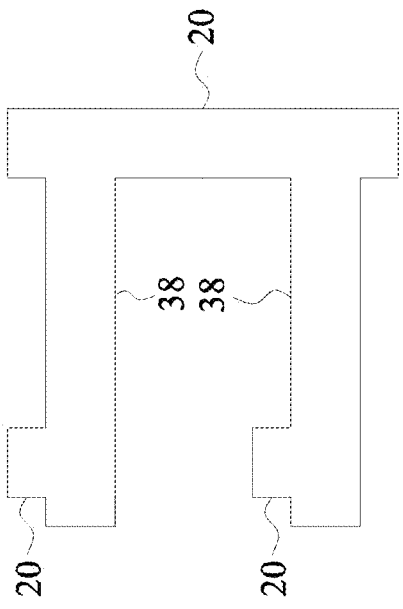
FIG. 8I is a plan view of another embodiment of the disclosure having two fins.
Figure 8J:
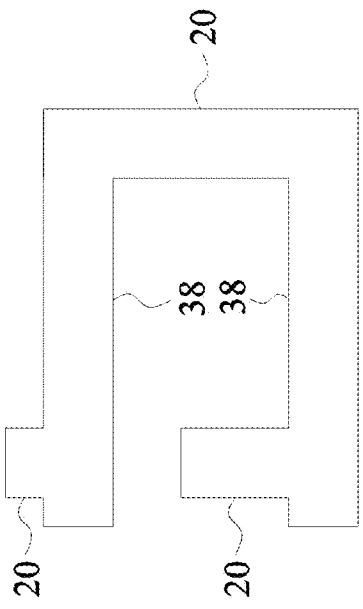
FIG. 8J is a plan view of another embodiment of the disclosure having two fins.
Figure 8K:
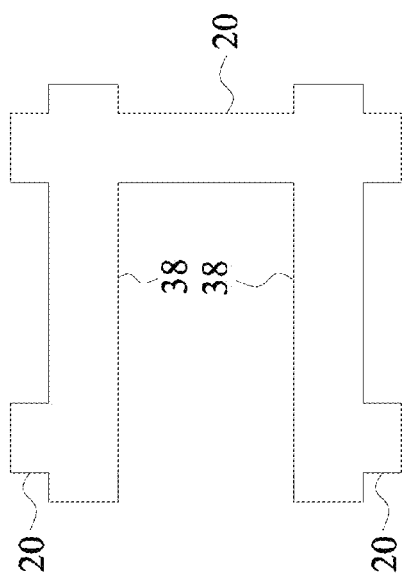
FIG. 8K is a plan view of another embodiment of the disclosure having two fins.
Figure 8L:
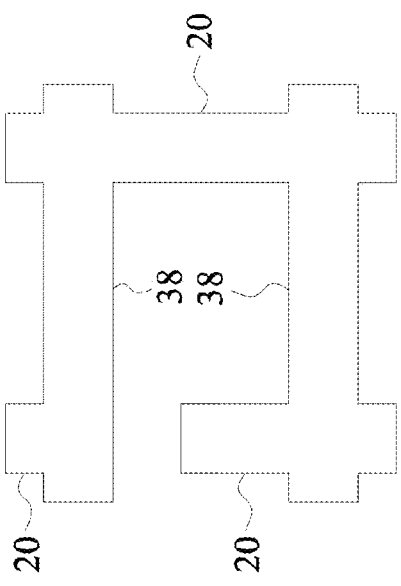
FIG. 8L is a plan view of another embodiment of the disclosure having two fins.

In certain embodiments having a plurality of fins, each fin 38 comprises two secondary portions 20, as shown in FIGS. 8A-8L. In some embodiments, the secondary portions 20 of immediately adjacent fins 38 are connected to each other, as shown in FIGS. 8A-8H. The secondary portions 20 may intersect the main portion 18 of the fin near the end of the main portion, as shown in FIGS. 8A and 8C or at the end of the main portion 18, as shown in FIGS. 8B and 8D. The secondary portions 20 may be formed only in the region between two immediately adjacent fins thereby connecting each of the fins, as shown in FIGS. 8C and 8D. In other non-limiting embodiments, the secondary portions 20 may be formed with one secondary portion extending outward from opposing sides of immediately adjacent fins and another fin formed only in the portion between two immediately adjacent fins, as shown in FIGS. 8E and 8F. In other embodiments, one secondary portion 20 may extend outward from one adjacent fin and not extend outward from the other adjacent fin, as shown in FIGS. 8G and 8H. In other embodiments, one pair of opposing secondary portions 20 of immediately adjacent fins may be connected while another pair of opposing secondary 20 are not connected, as shown in FIGS. 8I-8L. In some embodiments, the secondary portions 20 of adjacent fins may extend outward a different distance from the main portions 18, as shown in FIGS. 8K and 8L. Other configurations of the secondary portions within the scope of this disclosure would be apparent to one of ordinary skill in this art.

The secondary portions can be any suitable shape. In some embodiments, the secondary portions are substantially rectangular shaped or rounded.

Figure 9:
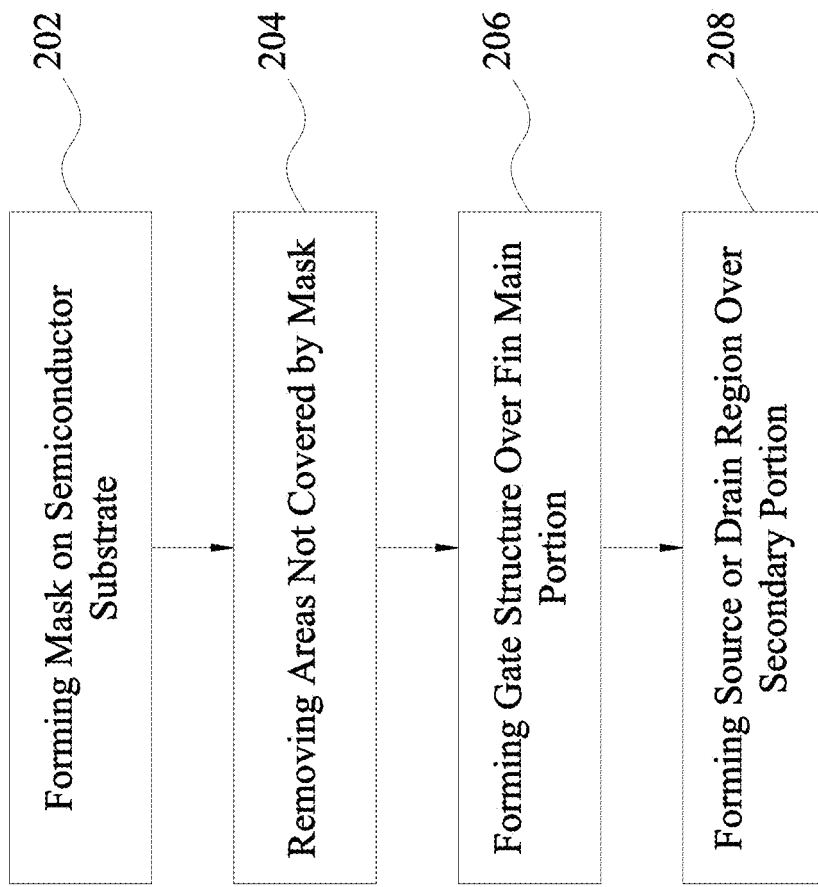
FIG. 9 is a flowchart of a method according to an embodiment of the disclosure.

In certain embodiments of the disclosure, a method 200 for fabricating a semiconductor device is provided, as illustrated in FIG. 9. The method 200 includes an operation 802 of forming a mask on a semiconductor substrate. The mask comprises a blocking portion that covers an area of the semiconductor substrate corresponding to a fin to be formed in the semiconductor substrate. The blocking portion includes a blocking main portion extending along a first direction, and at least one blocking secondary portion extending outward from the blocking main portion along a second direction not collinear with the first direction. The method 200 further includes an operation 204 of removing areas of the semiconductor substrate not covered by the blocking portion of the mask to form at least one fin including a fin main portion extending along the first direction, and at least one fin secondary portion extending outward from the fin main portion along a second direction not collinear with the first direction. After forming the fin, an operation 206 of forming a gate structure over the fin main portion is performed. In addition, the method includes an operation 208 of forming a source or drain region over the at least one secondary portion, to provide the semiconductor device.

In certain embodiments, forming a mask comprises depositing hard mask material over the semiconductor substrate, depositing a photoresist material over the hard mask material, and patterning the photoresist material and the hard mask material to form the blocking portion.

In certain embodiments, removing areas of the semiconductor substrate is performed by etching the hard mask material and the semiconductor substrate. Any suitable etchant can be used to etch the hard mask material and the semiconductor substrate.

Fins with a width of less than about 14 nm, such as 7 nm, may be prone to breaking by various extrinsic forces or fabrication process steps, thereby decreasing the production yield. Fins with lateral portions extending outward from the main portion have stronger structural strength in the main portion, and are thus, less prone to breaking. Therefore, the present disclosure provides a higher yield of semiconductor devices and improved semiconductor reliability in devices with fins having a width of less than about 14 nm.

In addition, source/drain regions formed over the primary and secondary portions of the fin have a greater contact area with the fin than similar source/drain regions formed over a linear shaped fin. The greater contact area provides lower contact resistance between the source/drain regions and the fin, thereby improving device performance.

According to an embodiment of the disclosure, a semiconductor device including at least one fin disposed on a surface of a semiconductor substrate is provided. The fin includes a main portion extending along a first direction, and at least one secondary portion extending outward from the main portion along a second direction not collinear with the first direction.

According to another embodiment of the disclosure, a semiconductor device includes a plurality of fins disposed on a surface of a semiconductor substrate. Each fin includes a main portion extending along a first direction. The main portion has opposing end regions and a middle region between the opposing end regions along the first direction. At least one secondary portion extends outward from the main portion along a second direction not collinear with the first direction.

According to yet another embodiment of the disclosure, a method for fabricating semiconductor device includes forming a mask on a semiconductor substrate. The mask comprises a blocking portion that covers an area of the semiconductor substrate corresponding to a fin to be formed in the semiconductor substrate. The blocking portion includes a blocking main portion extending along a first direction, and at least one blocking secondary portion extending outward from the blocking main portion along a second direction not collinear with the first direction. Areas of the semiconductor substrate not covered by the blocking portion of the mask are removed to form at least one fin including a fin main portion extending along the first direction, and at least one fin secondary portion extending outward from the fin main portion along a second direction not collinear with the first direction. A gate structure is formed over the fin main portion, and a source or drain region is formed over the at least one secondary portion.

As one of skill in the art would recognize some of the steps described in the above methods can be replaced or eliminated for other embodiments of the method.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   at least one fin disposed on a surface of a semiconductor substrate, the fin including:
      a main portion extending along a first direction, wherein the main portion comprises a first end region, a middle region, and a second end region extending along the first direction, wherein the first end region and the second end region are at opposing ends of the main portion and the middle region is between the first end region and the second end region,
      a first secondary portion extending outward from the main portion along a second direction not collinear with the first direction,
      a second secondary portion extending outward from an opposing side of the main portion along a third direction opposite to that of the second direction,
      wherein the first and second secondary portions extend from the main portion at either the first or second end region, and raised source/drain regions overlying the first and second end regions, wherein a height of the source/drain regions is greater than a height of the middle region of the fin.

2. The semiconductor device of claim 1, wherein a width W1 of the main portion of the fin between opposing main sides is about 3 nm to about 20 nm.

3. The semiconductor device of claim 2, wherein the width of the main portion of the fin is about 7 nm.

4. The semiconductor device of claim 1, further comprising a gate electrode structure formed at the middle region.

5. The semiconductor device of claim 4, wherein the gate electrode structure comprises a gate dielectric layer formed overlying the middle region, a gate electrode layer formed overlying the gate dielectric layer, and sidewall spacers formed on sides of the gate electrode layer.

6. The semiconductor device of claim 2, wherein the secondary portions extend a distance W2 outward from the main portion, wherein $0.14W1 \leq W2 \leq 7W1$.

7. The semiconductor device of claim 1, wherein one of the first and second secondary portions is located at the first end region and another one of the first and second secondary portions is located at the second end region.

8. A semiconductor device comprising:
first and second adjacent fins disposed on a surface of a semiconductor substrate, each fin including a main portion extending along a first direction, the main portion having opposing end regions and a middle region between the opposing end regions along the first direction;
at least one secondary portion extending outward from the main portion of the first fin at one of the end regions along a second direction away from the first and second fins;
at least one secondary portion extending outward from the main portion of the second fin at one end of the end regions along a third direction opposite to the second direction; and
raised source/drain regions overlying the opposing end regions, wherein a height of the source/drain regions is greater than a height of the middle region of each of the fins.

9. The semiconductor device of claim 8, wherein a width W1 of the main portions of the fins between opposing main sides is about 3 nm to about 20 nm.

10. The semiconductor device of claim 8, further comprising a gate electrode structure formed at the middle regions.

11. The semiconductor device of claim 10, wherein the gate electrode structure comprises a gate dielectric layer formed overlying the middle regions, a gate electrode layer formed overlying the gate dielectric layer, and sidewall spacers formed on sides of the gate electrode layer.

12. The semiconductor device of claim 9, wherein the secondary portions extend a distance W2 outward from the main portions, wherein $0.14W1 \leq W2 \leq 7W1$.

13. The semiconductor device of claim 1, wherein one of the first and second secondary portions is located at the first end region of the fin and another one of the first and second secondary portions is located at the second end region of the fin.

14. A semiconductor device comprising:
a plurality of fins disposed on a surface of a semiconductor substrate, each fin including a main portion extending along a first direction, the main portion having opposing end regions and a middle region between the opposing end regions along the first direction; and
at least one secondary portion extending outward from the main portion of each fin along a second direction not collinear with the first direction,
wherein at least one of the secondary portions extend outward from opposing main sides of the main portion of at least one of the fins, and the main portion of each fin extends along the first direction beyond where the at least one secondary portion extends outward to form a cross shape in plan view, and
wherein the secondary portions of immediately adjacent fins are connected to each other in a region between the immediately adjacent fins.

15. The semiconductor device of claim 14, wherein a width W1 of the main portions of the fins between opposing main sides is about 3 nm to about 20 nm.

16. The semiconductor device of claim 14, further comprising a gate electrode structure formed at the middle regions and source/drain regions formed at the first and second end regions.

17. The semiconductor device of claim 16, wherein the gate electrode structure comprises a gate dielectric layer formed overlying the middle regions, a gate electrode layer formed overlying the gate dielectric layer, and sidewall spacers formed on sides of the gate electrode layer.

18. The semiconductor device of claim 15, wherein secondary portions extend a distance W2 outward from the main portions in a direction away from the region between the immediately fins, wherein $0.14W1 \leq W2 \leq 7W1$.

19. The semiconductor device of claim 14, wherein the opposing end regions of each fin includes a first end region and an opposing second end region, a first secondary portion of a first fin is at the first end region of the first fin, and a second secondary portion of an immediately adjacent second fin is at the first end region of the second fin, wherein the first end region of the first fin is on the same side of the main portion of the first fin as the first end region of the second fin, and the first secondary portion and the second secondary portion extend in opposite directions away from the main portions of the respective first fin and second fin.

20. The semiconductor device of claim 14, wherein the opposing end regions of each fin includes a first end region and an opposing second end region, a first secondary portion of a first fin is at the first end region of the first fin, and a second secondary portion of an immediately adjacent second fin is at the second end region of the second fin,
wherein the first end region of the first fin is on the opposite side of the main portion of the first fin than the second end region of the second fin, and the first secondary portion and the second secondary portion extend in opposite directions away from the main portions of the respective first fin and second fin.

* * * * *